United States Patent
Du

(10) Patent No.: US 11,309,518 B2
(45) Date of Patent: Apr. 19, 2022

(54) MASK AND ENCAPSULATING METHOD OF DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Xiao Du, Wuhan (CN)

( * ) Notice: Subject to any disclaimer, the term of this patent is extended or adjusted under 35 U.S.C. 154(b) by 456 days.

(21) Appl. No.: 16/463,572

(22) PCT Filed: Jan. 22, 2019

(86) PCT No.: PCT/CN2019/072722
§ 371 (c)(1),
(2) Date: May 23, 2019

(87) PCT Pub. No.: WO2020/082634
PCT Pub. Date: Apr. 30, 2020

(65) Prior Publication Data
US 2021/0359256 A1     Nov. 18, 2021

(30) Foreign Application Priority Data
Oct. 26, 2018  (CN) .......................... 201811259724.2

(51) Int. Cl.
| | | |
|---|---|---|
| H01L 51/52 | (2006.01) | |
| C23C 14/04 | (2006.01) | |
| C23C 14/24 | (2006.01) | |
| H01L 51/00 | (2006.01) | |
| H01L 51/56 | (2006.01) | |

(52) U.S. Cl.
CPC ........ H01L 51/5253 (2013.01); C23C 14/042 (2013.01); C23C 14/24 (2013.01); H01L 51/0097 (2013.01); H01L 51/56 (2013.01); H01L 2251/5338 (2013.01)

(58) Field of Classification Search
CPC .................. C23C 14/042; C23C 14/24; H01L 2251/5338; H01L 51/0011; H01L 51/0097; H01L 51/5253; H01L 51/5256; H01L 51/56
See application file for complete search history.

(56) References Cited

U.S. PATENT DOCUMENTS

2018/0155818 A1* 6/2018 Mu .......................... C23C 14/12
2019/0093216 A1* 3/2019 Zhou ....................... H01L 51/56
(Continued)

FOREIGN PATENT DOCUMENTS

| CN | 104157550 A | 11/2014 |
|---|---|---|
| CN | 105803390 A | 7/2016 |

(Continued)

*Primary Examiner* — Jaehwan Oh
(74) *Attorney, Agent, or Firm* — JMB Davis Ben-David

(57) ABSTRACT

A mask and an encapsulating method of a display panel are provided. The mask is configured to encapsulating the display substrate. The display substrate includes a display area, a bonding area, and a notch. The mask includes an opening area and a non-opening area. A size of the mask is determined by a size of the used display substrate. A corresponding size of the display substrate adapts the mask having the corresponding size. The present disclosure can effectively prevent line damage and also improve substrate yield.

4 Claims, 4 Drawing Sheets

(56) References Cited

U.S. PATENT DOCUMENTS

2019/0100835 A1   4/2019  Obata et al.
2020/0303675 A1*  9/2020  Du ..................... H01L 51/0031

FOREIGN PATENT DOCUMENTS

CN      106567052 A    4/2017
CN      108004521 A    5/2018
WO      2014157068 A1  10/2014

* cited by examiner

MASK AND ENCAPSULATING METHOD OF DISPLAY PANEL

CROSS-REFERENCE TO RELATED APPLICATIONS

This is the U.S. National Stage of International Patent Application No. PCT/CN2019/072722, filed Jan. 22, 2019, which in turn claims the benefit of Chinese Patent Application No. 201811259724.2 filed Oct. 26, 2018.

FIELD OF DISCLOSURE

The present disclosure relates to the field of display technologies, and in particular to a mask and an encapsulating method of a display panel.

BACKGROUND

In recent years, development of a mobile terminal market has stimulated advancement of new display technologies. In order to meet needs of large-screen display and high screen-to-body ratio of mobile terminals, mobile phone industry has introduced a full-screen concept in past two years, which aims to increase a screen-to-body ratio of the mobile phone. Since the mobile phone need to reserve a corresponding space on one side of a screen for assembling a conversation module and a camera module of the mobile phone, many new full-screen phones have a notch at a top of a screen for placing the conversation module and the camera module, such as IPHONE X, HUAWEI's P20 series, etc. For narrow border and full-screen panel designs, organic light emitting diode (OLED) display devices have unique advantages. Flexible OLED display devices are a mainstream of current small and medium-sized panels. A conventional display panel adopts a glass sealant or a laser sintering encapsulation technology, which can be called a hard screen encapsulation, and cannot realize flexible characteristics such as bending or curving of a panel area. At present, a flexible encapsulating of a display screen mainly relies on thin film encapsulation (TFE) technologies.

At present, the thin film encapsulation technology for mass production applications is BARIX® encapsulation technology (inorganic-organic multi-films encapsulation), in which an inorganic film layer is fabricated by chemical vapor deposition (CVD) or atomic layer deposition (ALD) process, and an organic layer can be produced by chemical vapor deposition or inkjet printing (IJP) process. A protective film of the thin film encapsulation technology is limited to a display panel area when a substrate is encapsulated, and a panel bonding area and a test bar are prevented from being covered by a thin film encapsulation layer, resulting in subsequent process and test failure.

SUMMARY OF DISCLOSURE

An object of the present disclosure is to provide a mask and an encapsulating method of a display panel to solve the technical problems in the prior art that are prone to line damage and low substrate yield.

In order to achieve the above object, the present disclosure adopts the technical solution as follows.

The present disclosure provides a mask, comprising an opening area and a non-opening area; wherein the opening area comprises: two long borders arranged opposite each other; and a first short border and a second short border arranged opposite each other; and wherein the non-opening area comprises: a plate body, wherein the opening area is defined through the plate body; a first shield plate protruding from a central section of the first short border of the opening area; and a second shield plate protruding from the second short border of the opening area.

Furthermore, the first shield plate has an elongated shape, and an edge of the first shield plate is parallel to the second short border.

Furthermore, the second shield plate protrudes from a central section of the second short border of the opening area; and/or the second shield plate has an elongated shape and/or an isosceles trapezoid shape.

Furthermore, the second shield plate protrudes from a connecting section of another short border and one of the long borders of the opening area; and/or the second shield plate is a part of a circle, and the connecting section of the second shield plate and the opening area is an arc.

Furthermore, the mask further includes a mask frame, wherein an edge of the plate body is fixedly connected to the mask frame.

Furthermore, a width of the first shield plate ranges from 3 mm to 15 mm; and/or a width of the second shield plate ranges from 3 mm to 15 mm.

Another object of the present disclosure is to provides an encapsulating method of a display panel to solve the technical problems in the prior art that are prone to line damage and low substrate yield.

In order to achieve the above object, the present disclosure also provides an encapsulating method of a display panel which includes the following steps: in a substrate coating evaporation step, coating by evaporation a display substrate; in a first mask installation step, aligning the mask with the display substrate and attaching the mask onto the display substrate; in a first inorganic encapsulation layer formation step, forming a first inorganic encapsulation layer on the display substrate through the opening area of the mask; in a first mask removal step, removing the mask; in an organic encapsulation layer formation step, spraying an organic material on the display substrate, wherein the organic material is cured under ultraviolet irradiation to form an organic encapsulation layer; in a second mask installation step, aligning the mask with the display substrate and attaching the mask onto the display substrate; in a second inorganic encapsulation layer formation step, forming a second inorganic encapsulation layer on the display substrate through the opening area of the mask; in a second mask removal step, removing the mask.

Furthermore, the display substrate comprises: a display area comprising two long sides, a first short side, and a second short side, wherein the two long sides are arranged opposite each other, and the first short side and the second short side are arranged opposite each other; a bonding area disposed on a central section of the first short side; and a notch disposed on a central section of the second short side or on a connecting section of the second short side and one of the long sides.

Furthermore, the encapsulating method of the display panel includes the following steps:

in the first mask installation step or the second mask installation step, arranging the opening area of a corresponding mask being opposite to the display area of the display substrate; arranging the first shield plate of the corresponding mask being opposite to the bonding area of the display substrate; and arranging the second shield plate of the corresponding mask being opposite to the notch of the display substrate.

Furthermore, the encapsulating method of the display panel includes the following steps:

in the first inorganic encapsulation layer formation step, an upper surface of the display area is completely covered by the first inorganic encapsulation layer; in the organic encapsulation layer formation step, a portion of an upper surface of the first inorganic encapsulation layer other than an edge area is covered by the organic encapsulation layer; and in the second inorganic encapsulation layer formation step, the organic encapsulation layer and an upper surface of the edge area and a lateral surface of the first inorganic encapsulation layer are completely covered by the second inorganic encapsulation layer.

The present disclosure provides a mask and an encapsulating method of a display panel, which can be used for thin film encapsulating of flexible OLED panels with a variety of special-shaped designs. A flexible OLED panel with a conventional rectangle or rounded rectangle can be encapsulated, and a special-shaped flexible OLED panel also can be encapsulated to optimize a position and range of a thin film encapsulation layer. The thin film encapsulation layer of the present disclosure extends the conventional encapsulating process from covering a display area to a bonding area. A "concave" type of inorganic-organic hybrid encapsulation layer is formed in the bonding area by inkjet printing and plasma chemical vapor deposition or atomic deposition processes to protect a fragile circuit of the bonding area from damage during a flexible panel process. The present disclosure can effectively prevent line damage and also improve substrate yield.

BRIEF DESCRIPTION OF DRAWINGS

In order to more clearly illustrate the technical solutions of various embodiments of the present disclosure, drawings used in the description of embodiments will be given a brief description below. Apparently, the drawings in the following description only are some embodiments of the present disclosure, the ordinary skill in the art can obtain other drawings according to these illustrated drawings without creative effort.

Figure 1:
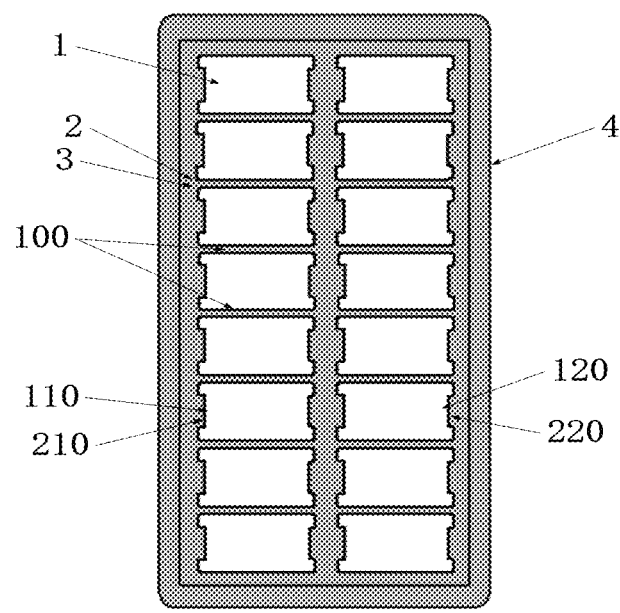
FIG. 1 is a structural diagram of a first mask of an embodiment of the present disclosure.

The reference numerals of the components in the drawing are as follows.

opening area 1, long border 100, first short border 110, second short border 120, another short border 130, plate body 2, first shield plate 210, second shield plate 220, non-opening area 3, mask frame 4, display substrate 5, display area 510, long side 5110, first short side 5120, second short side 5130, bonding area 520, wire on array (WOA) module 5201, fanout module 5202, VSS module 5203, flexible printed circuit (FPC) module 5204, notch 530, test area 6, first inorganic encapsulation layer 7, organic encapsulation layer 8, second inorganic encapsulation layer 9, barrier 10, first barrier 101, second barrier 102.

DETAILED DESCRIPTION

The following description with reference to the accompanying drawings is provided to clearly and completely explain the embodiments of the present disclosure. It is apparent that the following embodiments are merely some embodiments of the present disclosure rather than all embodiments of the present disclosure. All other embodiments obtained by a person of ordinary skill in the art based on the embodiments in the present disclosure without creative efforts shall belong to the protection scope of the present disclosure.

In addition, terms such as "first", "second" and "third" (if needed) are used herein for purposes of description and are not intended to indicate or imply relative importance or significance. It should be understood that objects described by "first", "second" and "third" (if needed) may be replaced by each other in some cases. Moreover, the terms "include", "contain" and any other variants mean to cover the non-exclusive inclusion.

The drawings, which are discussed below, and the various embodiments used to describe the principles of the present disclosure are intended to be illustrative only and not to limit the scope of the disclosure. Those skilled in the art will appreciate that the principles of the disclosure may be implemented in any suitably arranged system. Exemplary embodiments will be described in detail, examples of which are illustrated in the accompanying drawings. Furthermore, terminals according to exemplary embodiments will be described in detail with reference to the accompanying drawings. The same reference numerals in the drawings denote the same elements.

The terms used in the description of the present disclosure are intended to describe the specific embodiments and are not intended to illustrate the concept of the disclosure. Expressions used in the singular encompass the plural forms of expression unless the context clearly dictates otherwise. In the present specification, it will be understood that terms such as "comprise", "have", and "include" are intended to indicate the possibility of having the features, numbers, steps, acts, or combinations thereof disclosed in the description of the disclosure, and it is not intended to exclude the possibility that one or more other features, numbers, steps, acts, or combinations thereof may be added. The same reference numerals in the drawings denote the same parts.

In order to further illustrate the technical means and efficacy of the present disclosure for achieving the intended purpose of the invention, the specific embodiments, structures, features and functions of the present disclosure will be described in detail below with reference to the accompanying drawings and embodiments.

In this embodiment, a mask and a thin film encapsulation process for an OLED display panel having a notch on a screen are provided. As shown in FIG. 1, the mask includes an opening area 1 and a non-opening area 3. The opening area 1 includes two long borders 100 disposed opposite to each other and a first short border 110 and a second short border 120 disposed opposite to each other. The non-opening area 3 includes a plate body 2, where the opening area 1 is defined through the plate body 2. An edge of the plate body 2 is fixedly connected to a mask frame 4. This embodiment further includes a first shield plate 210 and a second shield plate 220. The first shield plate 210 protrudes from a central section of the first short border 110 of the opening area 1. The second shield plate 220 protrudes from the second short border 120 of the opening area 1. The opening area 1 is shaped approximately as a whole rounded rectangle.

Figure 2:
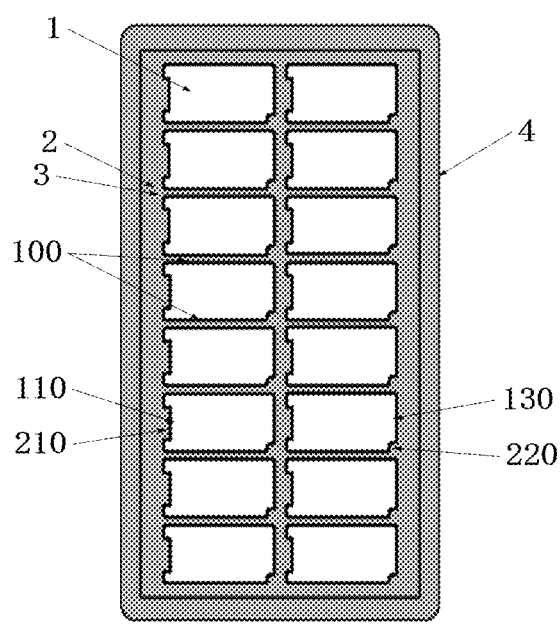
FIG. 2 is a structural diagram of a second mask of the embodiment of the present disclosure.

As shown in FIG. 1 and FIG. 2, one mask may include a plurality of opening areas 1, which are arranged in a matrix in two columns. An interval of the long borders 100 of each of the two opening areas 1 ranges from 0.02 mm to 0.2 mm, and a size of the mask is determined by a size of the used display substrate 5. A thickness of the mask ranges from 0.05 mm to 0.3 mm There is a certain taper corner in the opening area 1, and the mask has a corrosion-resistant protective film, such as alumina or TEFLON coating, to prevent damage to a mold during chemical vapor deposition or atomic deposition. The first shield plate 210 in the mask has an elongated shape. An edge of the first shield plate 210 is parallel to the second short border 120. The structure of the first mask is that the second shield plate 220 protrudes from a central section of the second short border 120 of the opening area 1, and a shape may be an elongated shape or an isosceles trapezoid shape. An edge of the second shield plate 220 is parallel to the first short border 110, and the second shield plate 220 is disposed opposite the first shield plate 210. In the structure of the second mask, the second shield plate 220 protrudes from a connecting section of another short border 130 and one long border 100 of the opening area 1. The second shield plate 220 is shaped as a part of a circle, and the connecting section of the second shield plate 220 and the opening area 1 are shaped as an arc.

Figure 3:
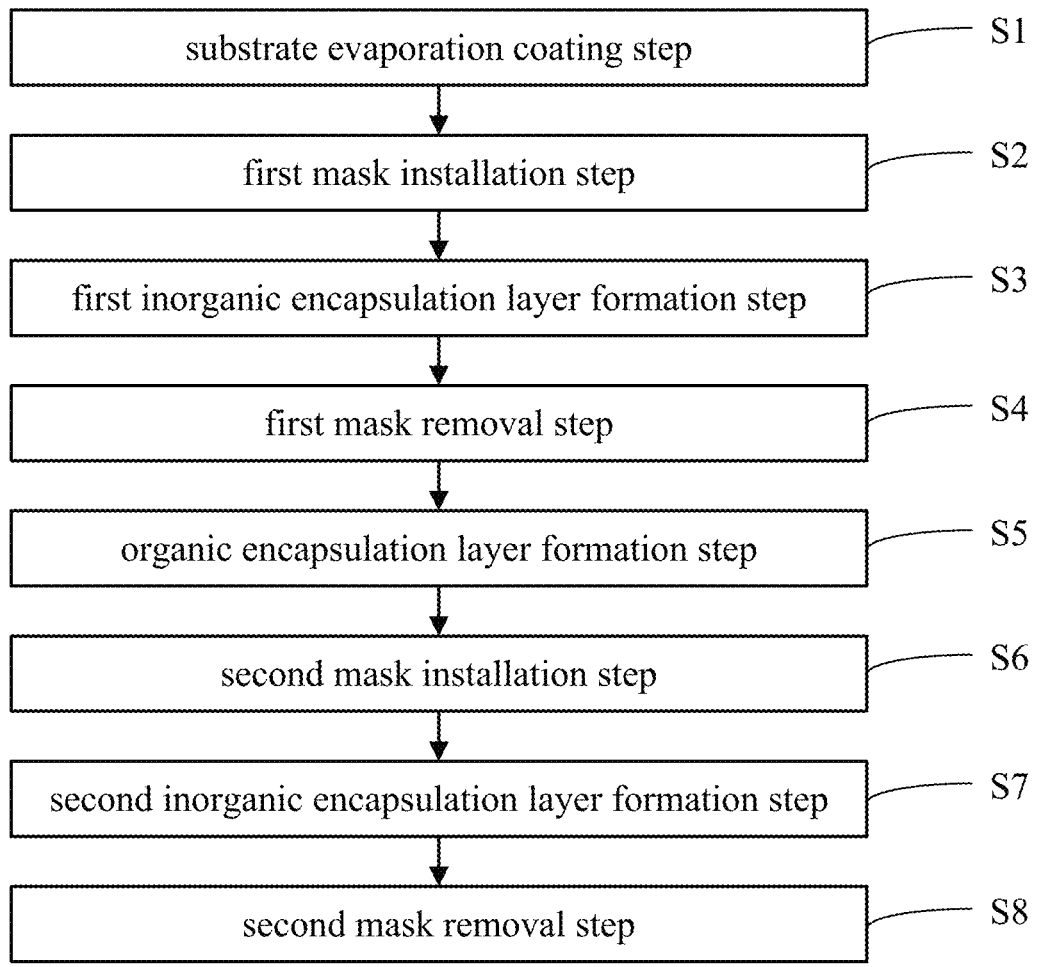
FIG. 3 is a flowchart of an encapsulating method of a display panel of the embodiment of the present disclosure.
Figure 4:
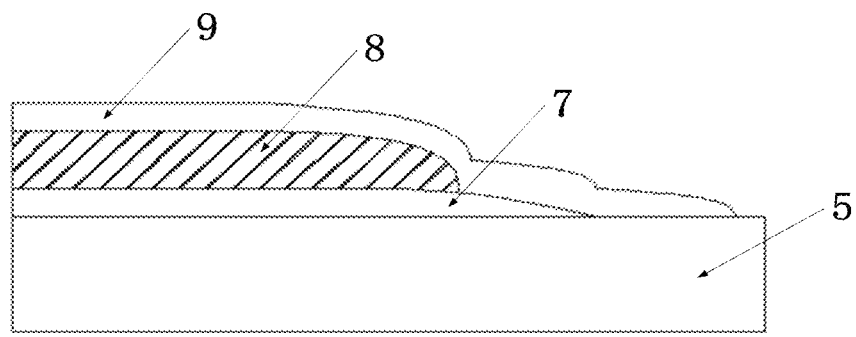
FIG. 4 is a structural diagram of an encapsulating structure on a display substrate of the embodiment of the present disclosure.

Another embodiment of the present disclosure also provides an encapsulating method of a display panel. The specific steps of the encapsulating method of the display panel can be referred to FIG. 3. As shown in FIG. 4, a thickness of the first inorganic encapsulation layer 7 may range from 0.3 um to 3 um, a thickness of the organic encapsulation layer 8 may range from 3 um to 20 um, and a thickness of the second inorganic encapsulation layer 9 may range from 0.3 um to 3 um.

Figure 5:
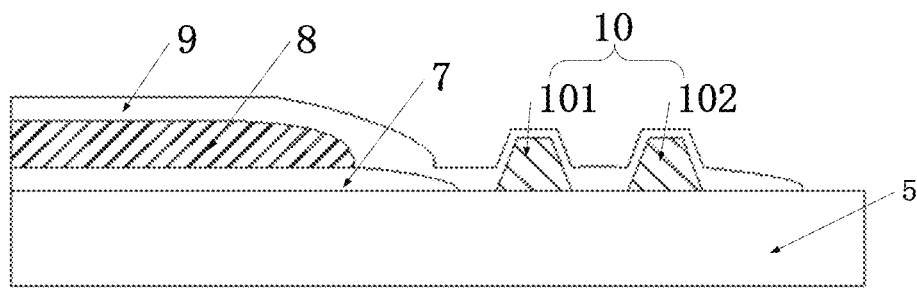
FIG. 5 is another structural diagram of the encapsulating structure on the display substrate of another embodiment of the present disclosure.

When an encapsulation process is performed, a substrate evaporation coating step S1 is performed for coating a display substrate 5 by evaporation. As shown in FIG. 5, the display substrate 5 is formed with two first barriers 101 and a second barrier 102 separated by a predetermined distance. The first barrier 101 and the second barrier 102 are combined to form a barrier 10, and the first barrier 101 and the second barrier 102 can form a stair structure, which can better prevent an organic material from crossing the barrier 10.

Figure 6:
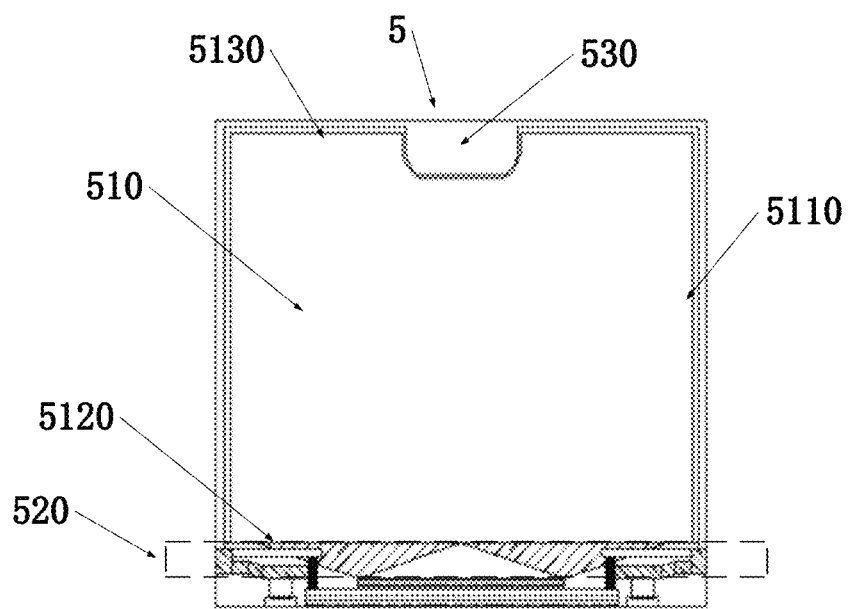
FIG. 6 is a partial structural diagram of a bonding area of the display substrate of the embodiment of the present disclosure.
Figure 7:
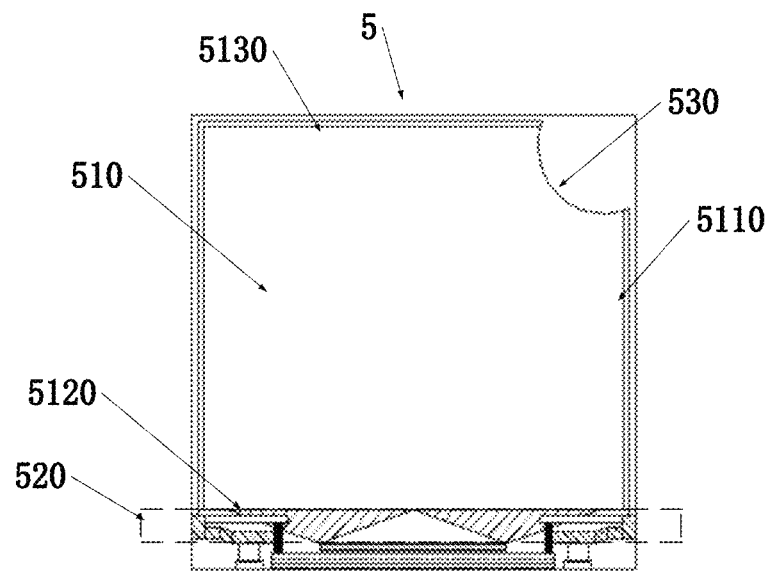
FIG. 7 is another partial structural diagram of the bonding area of the display substrate of the embodiment of the present disclosure.
Figure 8:
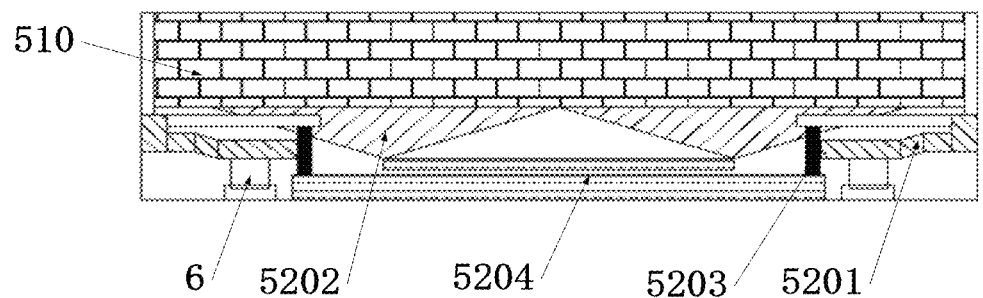
FIG. 8 is a structural diagram of a bonding area of the embodiment of the present disclosure.

As shown in FIG. 6 and FIG. 7, the display substrate 5 includes a display area 510, a bonding area 520, and a notch 530 (not shown in FIG. 6). The display area 510 includes two oppositely disposed long sides 5110, a first short side 5120 and a second short side 5130, where the first short side 5120 and the second short side 5130 are arranged opposite each other. The bonding area 520 is disposed at a central section of the first short side 5120, and the notch 530 is disposed at a central section of the second short side 5130 or disposed at a connecting section of the second short side 5130 and one of the long sides 5110. In addition, as shown in FIG. 8, the bonding area 520 includes a wire on array (WOA) module 5201, a fanout module 5202, a VSS module 5203, and a flexible printed circuit (FPC) module 5204. The above modules are a layout design for powering the display substrate 5. A test area 6 is also included, and the test area 6 is exposed, so that this can be easily maintained and overhauled by technicians.

In a first mask installation step S2, the first mask is transferred to a corresponding machine chamber, and the display substrate 5 is placed on a platform of a carrier substrate to ensure that an edge of the display substrate 5 is completely stuck in a recess of the platform. A first mask lifting device in the first chamber is lowered, and a CCD image sensor (i.e., a charge-coupled component) is aligned with the display substrate 5, so that the first mask is attached onto the display substrate 5. A size of the first mask is determined by a size of the used display substrate 5, and a corresponding size of the display substrate 5 adapts the mask having the corresponding size.

As shown in FIG. 1, in the first mask installation step, after the first mask is aligned with and attached onto the display substrate 5, the opening area 1 of the mask is set opposite to the display area 510 of the display substrate 5. Specifically, the long border 100 of the mask is opposite to the long side 5110 of the display area 510, and the first short border 110 of the mask is opposite to the first short side 5120 of the display area 510. The second short border 120 of the mask is opposite to the second short side 5130 of the display area 510. The first shield plate 210 of the mask protrudes from a central section of the first short border 110 of the opening area 1, and is opposite to a central section (i.e., the bonding area 520) of the first short side 5120 of the display area 510. The second shield plate 220 of the mask protrudes from a central section of the second short border 120 of the opening area 1, and is opposite to a central section (i.e., the notch 530) of the second short side 5130 of the display area 510.

In a formation step S3 of a first inorganic encapsulation layer 7, the first inorganic encapsulation layer 7 is formed on the display substrate through the opening area 1 of the first mask. The first inorganic encapsulation layer 7 can be formed by a plasma enhanced chemical vapor deposition (PECVD), an atomic layer deposition (ALD), a pulsed laser deposition, or a sputtering method, and can be made of an inorganic material that effectively prevents moisture, such as silicon nitride, silicon oxynitride, or aluminum oxide film. In addition, a film structure may be a single layer film or a multilayer film, and it covers the display area 510 and the WOA module 5201 and the fanout module 5202 of the bonding area 520. A film forming range is 50 to 1000 um from the display area 510. A pattern of the first inorganic encapsulation layer 7 is a special-shaped pattern covering both the display area 510 and the bonding area 520.

In a first mask removal step S4, the display substrate 5 is separated from the first mask.

FIG. 6 is a structural diagram of the display substrate 5 which is encapsulated by using the first mask.

In a formation step S5 of an organic encapsulation layer 8, an organic material is sprayed on the display substrate 5 by an inkjet printing method, and the organic material is cured under ultraviolet irradiation to form the organic encapsulation layer 8. The organic material for forming the organic encapsulation layer 8 may be acrylic, hexamethyldisiloxane (HMDSO), polyacrylic, polycarbonates, polystyrenes, etc. A coverage range of the organic encapsulation layer 8 on the display area 510 is 30 um to 300 um smaller than a coverage range of the first inorganic encapsulation layer 7. The organic encapsulation layer may cover the first inorganic encapsulation layer 7 while covering the WOA module 5201 and the fanout module 5202 of the bonding area 520. A pattern of the organic encapsulation layer 8 will be determined according to a spray recipe. An inkjet pattern in a normal case is the same as the barrier 10 on the display substrate 5.

In a second mask installation step S6, the second mask is transferred to a corresponding second machine chamber, and the display substrate 5 is placed on a platform of a carrier substrate to ensure that an edge of the display substrate 5 is completely stuck in a recess of the platform. A second mask lifting device in the chamber is lowered, and a CCD image sensor (i.e., a charge-coupled component) is aligned with the display substrate 5, so that the second mask is attached onto the display substrate 5. A size of the second mask is determined by a size of the used display substrate 5, and a corresponding size of the display substrate 5 adapts the mask having the corresponding size.

As shown in FIG. 2, in the second mask installation step, after the second mask is aligned with and attached onto the display substrate 5, the opening area 1 of the mask is arranged opposite to the display area 510 of the display substrate 5. Specifically, the long border 100 of the mask is opposite to the long side 5110 of the display area 510, and the first short border 110 of the mask is opposite to the first short side 5120 of the display area 510. Another short border 130 of the mask is opposite to the second short side 5130 of the display area 510. The first shield plate 210 of the mask protrudes from a central section of the first short border 110 of the opening area 1, and is opposite to a central section (i.e., the bonding area 520) of the first short side 5120 of the display area 510. The second shield plate 220 of the mask protrudes from a central section of another short border 130 of the opening area 1, and is opposite to a connecting section (i.e., the notch 530) of the second short side 5130 and one of the long sides 5110 of the display area 510.

In a formation step S7 of a second inorganic encapsulation layer 9, the second inorganic encapsulation layer 9 is formed on the display substrate 5 through the opening area 1 of the first mask. The second inorganic encapsulation layer 9 can be formed by a plasma enhanced chemical vapor deposition (PECVD), an atomic layer deposition (ALD), a pulsed laser deposition, or a sputtering method, and can be made of an inorganic material that effectively prevents moisture, such as silicon nitride, silicon oxynitride, or aluminum oxide film. In addition, a film structure may be a single layer film or a multilayer film. Due to insufficient water-oxygen barrier capability of the organic film, the second inorganic film layer 9 needs to completely cover the organic encapsulation layer 8 to prevent water and oxygen from infiltrating a bottom layer through a side of the organic encapsulation layer 8. Therefore, a film forming area of the second inorganic encapsulation layer 9 is 50 to 500 um form the covering range of the organic encapsulation layer 8.

In a second mask removal step S8, the display substrate 5 is separated from the second mask.

FIG. 7 is a structural diagram of the display substrate 5 which is encapsulated by using the second mask.

Figure 9:
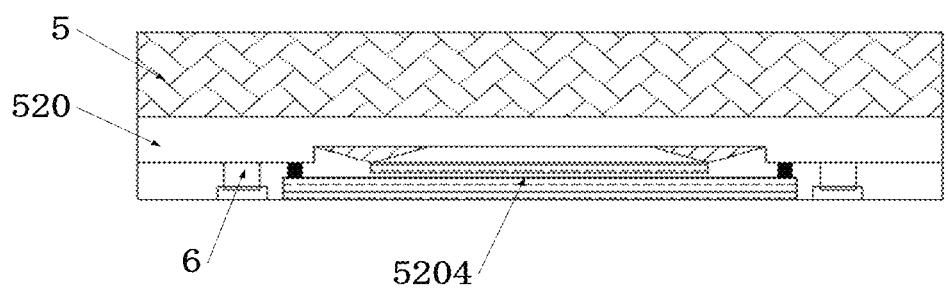
FIG. 9 is a structural diagram of the display substrate which is encapsulated of the embodiment of the present disclosure.

As shown in FIG. 9, after the above steps are completed, the encapsulated display substrate 5 is transferred to an automated optical inspection (AOI) machine to check the film formation state of the film encapsulation, or directly enters a next process.

In this embodiment, the metal mask used to form the first inorganic encapsulation layer 7 and the second inorganic encapsulation layer 9 is transferred from a mask stock by a robot arm, and placed in the first machine chamber or the second machine chamber of the corresponding chemical vapor deposition or atomic deposition machine. The machine chamber is provided with a mold lifting device for lifting the mask.

The display substrate 5 that is evaporated is transferred to the first chamber of the plasma chemical vapor deposition or the atomic deposition machine, and the display substrate 5 is placed on the platform of the carrier substrate, and the edge of the display substrate 5 can be completely stuck into the recess of the platform.

At this time, the first machine chamber is provided with the CCD image sensor for aligning the display substrate 5, and the display substrate 5 also can be aligned by using a pin hole of the first mask frame 4, such that the opening area 1 of the first mask is aligned with an area of the display substrate 5 which is need to be coated. The first mask and the display substrate 5 are tightly assembled by a weight of the first mask or a pressure applied by the platform. After a series of processes, the first inorganic encapsulation 7 is accomplished. A pattern of the encapsulation layer is the same as that of the display area 510, and the display area 510 can be completely covered.

After forming the first inorganic encapsulation layer 7, the display substrate 5 is separated from the first mask. The display substrate 5 is transferred from the first chamber of chemical vapor deposition or atom deposition machine to the inkjet printing machine. According to a predetermined recipe, the ink is sprayed on the surface of the display substrate 5 and cured under ultraviolet light to form the organic encapsulation layer 8. Covering patterns of the organic encapsulation layer 8 and the second inorganic encapsulation layer 9 are the same, but one need to be retracted by a certain distance. They cover the WOA module 5201 and the fanout module 5202 of the bonding area 520. The pattern of the organic encapsulation layer 8 described above is a special-shaped pattern.

After the organic encapsulation layer 8 is formed, the display substrate 5 is transferred to the first chamber of the plasma chemical vapor deposition or atomic deposition machine, and the display substrate 5 is placed on the platform of the carrier substrate, and the edge of the display substrate 5 can be completely stuck into the recess of the platform.

The second machine chamber is provided with the CCD image sensor for aligning the display substrate 5, and the display substrate 5 also can be aligned by using a pin hole of the first mask frame 4, such that the opening area 1 of the second mask is aligned with an area of the display substrate 5 which is need to be coated. The second mask and the display substrate 5 are tightly assembled by a weight of the second mask or a pressure applied by the platform. After a series of processes, the second inorganic encapsulation 7 is accomplished. The formed inorganic film can completely cover the organic encapsulation layer 8 and extend outwardly to a certain extent, thereby preventing water and oxygen from infiltrating the display area 510 through a side of the encapsulation.

After the encapsulating is completed, the display substrate 5 is separated from the second mask and is transferred to an automated optical inspection (AOI) machine to check the film formation state of the film encapsulation, or directly enters a next process The present disclosure provides the mask and the encapsulating method of the display panel, which can be used for thin film encapsulating of flexible OLED panels with various special-shaped designs. In this embodiment, different masks are used according to different shapes of the display area 510. When installing the mask, the opening area 1 of the mask is opposite to the display area 510 of the display substrate 5. The first shield plate 210 of the mask is opposite to the bonding area 520 of the display substrate 5. The second shield plate 220 of the mask is opposite to the notch 530 of the display substrate 5.

The first shield plate 210 refers an inwardly extending shield plate formed at the opening area 1 of the mask corresponding to the bonding area 520 of the display substrate 5, and it extends to 100 to 500 um from a boundary of the notch 530. The second shield plate 220 refers an inwardly extending shield plate formed at the opening area 1 of the mask corresponding to a top of the display substrate 5, and it extends to 100 to 500 um from a top edge of the FPC module 5204. The shape and extension of the first shield plate 210 and the second shield plate 220 are designed according to the size of the opening area 1. The size of the opening area 1 is designed according to the size of the display substrate 5. Widths of the first shield plate 210 and the second shield plate 220 ranges from 3 to 15 mm and they are located on the same plane as a light shielding area. If designing a thin film encapsulation of an OLED display panel having the notch 530 on the screen, this will better protect a wiring of the special-shaped bonding area 520 to avoid damage during the process and further improve the yield of the substrate 5.

In this embodiment, the opening area 1 of the mask is compared with the display area 510, and the two long borders 100 and the second short border 120 of the opening area of the mask are extended outwardly by 100 to 500 mm, and the bonding area 520 corresponding to the opening area 1 is separated from an upper edge of the test area 6 by 100 to 500 um. This can further delay the entry of water and oxygen into the thin film encapsulation layer.

Furthermore, the mask is fixed to the mask frame 4 by laser welding, and a size and design of the frame are determined by an internal structure of the machine. The mask is a metal with a thickness of 0.05 to 0.3 mm A surface is covered with a protective film with corrosion resistance, such as alumina or polytetrafluoroethylene, to protect the surface of the mask from damage. There are a plurality of opening areas 1 in the mask, and each of the opening areas 1 has a partially etched area toward the edge of the display substrate 5 to prevent the edge of the opening area 1 of the mask from scratching the display substrate 5.

The present disclosure provides the mask and the encapsulating method of the display panel, which can be used for thin film encapsulating of screens with a variety of special-shaped designs. The special-shaped design referred to here is defined according to the pattern of the notch 530. The common encapsulating method of the display panel has been improved from covering a conventional rectangle or rounded rectangle to a special-shaped area, so as to optimize a position and range of a thin film encapsulation layer. The thin film encapsulation layer of the present disclosure extends the conventional encapsulating process from covering the display area 510 to the bonding area 520. The FPC module 5204 and test area 6 of bonding area 520 are exposed. A "concave" type of inorganic-organic hybrid encapsulation layer is formed in the bonding area 520 by inkjet printing and plasma chemical vapor deposition or atomic deposition processes to protect a fragile circuit of the bonding area 520 from damage during a flexible panel process. The present disclosure can effectively prevent line damage and also improve the yield of the substrate 5.

The terms "a", "the", and the like used in the description of the concept of the disclosure (especially in the appended claims) should be interpreted to cover both singular and plural. In addition, unless otherwise stated herein, a range of values is recited herein to refer to each individual value that belongs to the relevant range. Each individual value is incorporated into this specification as if these values were stated separately herein. Furthermore, the steps of all methods described herein can be performed in any suitable sequence, unless otherwise indicated herein or clearly contradicted by context. The changes of the disclosure are not limited to the sequence of described steps. The use of any and all examples, or exemplary language (e.g., "such as") provided herein, is intended merely to better illuminate the disclosure and does not pose a limitation on the scope of the disclosure unless otherwise claimed. Various modifications to these exemplary embodiments will be readily apparent to those skilled in the art without departing from the spirit or scope of the disclosure.

The mask and the encapsulating method of the display panel are provided above for the embodiments of the present disclosure. It should be understood that the exemplary embodiments described herein are to be considered in a descriptive manner only, and are intended to aid in understanding the method of the present disclosure and its core idea, but are not intended to limit the present disclosure. Descriptions of features or aspects in each exemplary embodiment should generally be considered as suitable features or aspects in other exemplary embodiments. Although the present disclosure is described with reference to the exemplary embodiments, various changes and modifications can be made by those skilled in the art. The present disclosure is intended to cover such changes and modifications within the scope of the appended claims.

What is claimed is:

1. An encapsulating method of a display panel, comprising:
   in a substrate evaporation coating step S1, coating by evaporation a display substrate;
   in a first mask installation step S2, aligning a first mask with the display substrate and attaching the first mask onto the display substrate, wherein the first mask comprises an opening area and a non-opening area, wherein the opening area comprises a first short border and a second short border arranged opposite each other, and wherein the non-opening area comprises a first shield plate protruding from a central section of the first short border of the opening area; and a second shield plate protruding from a central section of the second short border of the opening area;
   in a first inorganic encapsulation layer formation step S3, forming a first inorganic encapsulation layer on the display substrate through the opening area of the first mask;
   in a first mask removal step S4, removing the first mask;
   in an organic encapsulation layer formation step S5, spraying an organic material on the display substrate, wherein the organic material is cured under ultraviolet irradiation to form an organic encapsulation layer;
   in a second mask installation step S6, aligning a second mask with the display substrate and attaching the second mask onto the display substrate, wherein the second mask comprises another opening area and another non-opening area, wherein the opening area comprises another first short border and another second short border arranged opposite each other, and wherein the non-opening area comprises: another first shield plate protruding from a central section of the first short border of the opening area; and another second shield plate protruding from a connecting section of the second short border and one of long borders of the opening area;

in a second inorganic encapsulation layer formation step S7, forming a second inorganic encapsulation layer on the display substrate through the opening area of the second mask;

in a second mask removal step S8, removing the second mask.

2. The encapsulating method of a display panel as claimed in claim 1, wherein the display substrate comprises:

a display area comprising two long sides, a first short side, and a second short side, wherein the two long sides are arranged opposite each other, and the first short side and the second short side are arranged opposite each other;

a bonding area disposed on a central section of the first short side; and a notch disposed on a central section of the second short side or on a connecting section of the second short side and one of the long sides.

3. The encapsulating method of a display panel as claimed in claim 2, in the first mask installation step or the second mask installation step, further comprising:

arranging the opening area of a corresponding mask being opposite to the display area of the display substrate;

arranging the first shield plate of the corresponding mask being opposite to the bonding area of the display substrate; and arranging the second shield plate of the corresponding mask being opposite to the notch of the display substrate.

4. The encapsulating method of a display panel as claimed in claim 2, wherein in the first inorganic encapsulation layer formation step, an upper surface of the display area is completely covered by the first inorganic encapsulation layer;

in the organic encapsulation layer formation step, a portion of an upper surface of the first inorganic encapsulation layer other than an edge area is covered by the organic encapsulation layer; and in the second inorganic encapsulation layer formation step, the organic encapsulation layer and an upper surface of the edge area and a lateral surface of the first inorganic encapsulation layer are completely covered by the second inorganic encapsulation layer.

* * * * *